(12) United States Patent
Kim et al.

(10) Patent No.: US 6,233,183 B1
(45) Date of Patent: May 15, 2001

(54) SEMICONDUCTOR MEMORY DEVICE WITH HIGH DATA ACCESS SPEED

(75) Inventors: Yong Ki Kim, Kyoungki-do; Cheol Woo Jeong, Seoul, both of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/539,827

(22) Filed: Mar. 31, 2000

(30) Foreign Application Priority Data

Apr. 3, 1999 (KR) .................................................. 99-11709

(51) Int. Cl.[7] ....................................................... G11C 7/00
(52) U.S. Cl. .......................................... 365/200; 365/225.7
(58) Field of Search .................................. 365/200, 225.7

(56) References Cited

U.S. PATENT DOCUMENTS 5,732,029 * 3/1998 Lee et al. .............................. 365/200
6,118,712 * 9/2000 Park et al. ............................ 365/200

* cited by examiner

*Primary Examiner*—Trong Phan
(74) *Attorney, Agent, or Firm*—Pillsbury Winthrop LLP

(57) ABSTRACT

A semiconductor memory device, comprising: address input means for receiving an external column address signal; address buffer means for converting the external column address signal through address input terminal into an internal column address signal; address predecoder means for receiving the internal column address signal from the address buffer means and predecoding it to generate global column address signals; column redundancy fuse array means for generating a first detection signal indicating whether the global column address signals are normal address signals or spare address signals and a second detection signal indicating that the defects are fully repaired with any one of a column redundancy circuit or a row redundancy circuit; redundancy selection means for generating a spare column enable signal or a normal column enable signal in accordance with the first detection signal; address block repeater means for directly providing the global column address signals from the predecoder as column address signals in accordance with the second detection signal from the redundancy fuse array means regardless of the normal column enable signal, or for delaying the global column address signals from the predecoder for a selected time in accordance with the normal column enable signal and providing them as the column address signals; column main decoder means for decoding the column address signals from the address block repeater means to generate a column selection signal; and spare column decoder means for generating a spare column selection signal by the spare column enable signal from the redundancy selection means.

6 Claims, 7 Drawing Sheets

SEMICONDUCTOR MEMORY DEVICE WITH HIGH DATA ACCESS SPEED

BACKGROUND OF THE INVENTION

This invention relates to a semiconductor memory device with high data access speed for preventing selectively data delay in redundancy logic.

In general, dynamic random access memories (DRAMs) which are most widely used among semiconductor memory devices is widely used with the lowest value in the memory portion of the computer main memories and peripheral equipment. In particular, because the semiconductor memory devices are manufactured with microprocessing technique using high integration technology, probability to fail in the main parts of the memory device is high. In general, a technique is used to repair defects with spare elements. The technique is called as redundancy technology and logic embodying the redundancy technology is called as defect repair logic, redundancy logic or spare logic.

The portion of the memory device which is undoubtedly be repaired is a memory cell array. It is because the semiconductor memory chip can not used when any one of memory cells in the memory cell array is defective. The memory device with matrix type includes redundancy logic where spare memory cells are provided in row or in column of the memory cell array and when the defect in any memory cell of memory cell array, the defective memory cell is substituted by the space memory cell. The spare logic is a row redundancy logic and a column redundancy logic.

In general, the memory devices, typical DRAMs, carry out the read and write operation for reading/writing data from/in the memory cell array with commands combined with address. Because the access speed is an essential factor for estimating performance of the memory device, the memory device with high access speed has a superior competitiveness.

However, the redundancy logic circuit has a problem to delay access speed. So as to understand the problem, the operation of typical DRAM will be first described hereinafter.

It uses address multiplexing method that a row address and a column address are provided with time delay in the DRAM. When a row address strobe (RAS) signal is activated, the row address is received and when a column address strobe (CAS) signal is activated, the column address is received so that finally, the selected memory cell is accessed. In DRAM operation, the activation speed of the RAS signal is more important than that of the CAS signal. It is because of DRAMs, synchronous dynamic random access memories (SDRAMs) operates with burst mode that the consecutive CAS activation following one RAS activation so that the data access speed determines the performance of DRAMs.

In particular, SDRAM outputs data in syncronization with clock and generates an external address signal or an internal address signal at a toggle edge of every clock to select a column selection signal. Accordingly, the speed to select the column selection signal determines data access speed with CAS activation.

FIG. 1 shows a block diagram of a DRAM in the prior art. The prior redundancy circuit includes a plurality of address input terminals 10 for receiving an external column address signal Y-add bit by bit; a plurality of address input buffers 20 for converting the external column address signal Y-add through the address input terminals 10 into an internal column address signal bit by bit, each of the address input buffers 20 being corresponding to each of the address input terminals; an address predecoder 30 for predecoding the internal column address signal from the address input buffers 20 to generate global column address signals GAYij; a column redundancy fuse array 40 for receiving the global column address signals GAYij and detecting whether they are redundancy addresses to generate a spare detection signal SD; a redundancy selector 50 for selectively generating a normal column enable signal NCE or a spare column enable signal SCE in accordance with the spare detection signal SD from the column redundancy fuse array 40; an address block repeater for receiving the global column address signals GAYij and the normal column enable signal NCE to generate column address signals BAYij; a column main decoder 70 for receiving the column address signals BAYij from the address block repeater 60 and decoding them to generate column selection signals Yi<n>; and a spare column decoder 80 for receiving the spare column enable signal SCE from the redundancy selector 50 to generate spare column selection signals SYi.

FIG. 2 shows a circuit diagram of the address block repeater in FIG. 1. The address block repeater 60 includes a first delay portion 61 to a fourth delay portion 64 for respectively receiving the predecoded address signals GAY01<0>–GAY01<3> and for delaying them for a selected time which is a desired minimum time for detecting the redundancy; a plurality of a first to a fourth AND logic portions 65–68 for receiving the normal column enable signal NCE and output signals of the delay portions 61–64 to generate column address signals BAY01<0>–BAY<3>.

The delay portions include a plurality of inverters IV1–IV4, IV5–IV8, IV9–IV12 and IV13–IV16 connected in series and the AND logic portions include NAND gate NA1–NA4 and inverter IV17–IV20.

FIG. 3 shows a circuit diagram of the column main decoder in FIG. 1. The column main decoder 70 receives the column address signals BAY<0>–BAY<3> from the address block repeater 60 of FIG. 2 and decodes them to activate any one of the column selection signals Yi<0>–Yi<3>.

FIG. 4 shows a circuit diagram of the column redundancy fuse array in FIG. 1. The column redundancy fuse array includes a PMOS transistor MP1 for precharging the potential of a defect detection node Nd1 with a power voltage Vdd by a precharge signal pcg which is applied to a gate thereof; a plurality of NMOS transistors MN1–MN12 which receive the global column address signals GAY01<0>–GAY45<3> from the address predecoder 30 to drop the potential of the node Nd1 to a ground terminal Vss; a plurality of fuses F1–F12 connected to the defect detection node Nd1 and drains of the NMOS transistors MN1–MN12; a plurality of inverters IV1–IV2 connected to the defect detection node Nd1, for generating the spare detection signal SD.

If the global address signals corresponding to the defect cells are GAY01<0>, GAY23<0> and GAY45<0>, so as to detect the global address signal GAY01<0>, GAY23<0> and GAY45<0>, the fuses F1, F5, F9 connected to the NMOS transistors MN1, MN5 and MN9 where the global address signals are applied to gates become blown by using laser. At this time, if other addresses GAY01<1>–GAY01<3>, GAY23<1>–GAY23<3>, GAY45<1>–GAY45<3> except for the above redundancy address GAY01<0>, GAY23<0> and GAY45<0> are received from the predecoder 30, potential of the defect detection node Nd1 becomes at a ground level Vss by the non-blown fuses F2–F4, F6–F8 and F10–F12 so that it becomes at logic low level. Finally, the column redundancy fuse array 40 generates the spare detection signal SD of logic low level.

On the other hand, if the redundancy addresses GAY01<0>, GAY23<0> or GAY45<0> are received, because the fuses F1, F5, and F9 corresponding to the redundancy address are already blown, the defect detection node Nd1 maintains its initial logic high level. Finally, the redundancy fuse array 40 generates the spare detection signal SD of logic high level.

FIG. 5 shows a circuit diagram of the redundancy selector and the spare column decoder in FIG. 1. The redundancy selector 50 which receives the spare detection signal SD from the column redundancy fuse array 40 to generate the normal column enable signal NCE and a spare column enable signal SCE, includes inverters IV23 and IV25 for inverting the spare detection signals SD(0) and SD(1) and generating output signals NCD(0) and NCD(1), respectively; inverters IV24 and IV26 for inverting the output signals of inverters IV23 and IV25 to generate the spare column enable signals SCE (0) and SCE (1), respectively to the spare column decoder 80; a NAND gate NA5 for carrying out logic NAND of the output signals NCD(0) and NCD(1); an inverter IV27 for inverting an output signal of the NAND gate NA5 to generate the normal column enable signal NCE to the address block repeater 60.

The spare column decoder 80 which receives the spare column enable signals SCE(0) and SCE(1) from the redundancy selector 50 to generate spare column selection signals SY(0) and SY(1), includes NAND gates NA6 and NA7 for receiving output signals SCE(0) and SCE(1) from the redundancy selector 15 as one input signal, respectively and the global column address signal GAY01 predecoded from the predecoder 30 as the other input signal and inverters IV28–IV30 and IV31–IV33 for inverting output signals of NAND gates NA6 and NA7 to generate the spare column selection signals SY(0) and SY(1), respectively.

The redundancy selector 50 controls the address block selection 60 and the spare column decoder 80 in accordance with the spare detection signals SD(0) and SD(1) from the column redundancy fuse array 50.

For example, the normal address signals are received, the redundancy fuse array 40 outputs the output signals SD(0) and SD(1) of logic low level so that the signals SD(0) and SD(1) provided to the redundancy selector 50 are transited into logic low level by the inverters IV23 and IV25. The signals SD(0) and SD(1) of logic low level are transited into the normal column selection signal NCE of logic low level through the NAND gate NA5 and the inverter IV27.

On the other hand, the signals SD(0) and SD(1) of logic low level from the redundancy selector 50 pass the inverters IN23, IV24 and IV25, IV26 without level transition to maintain the logic low level and then provided to the one input signal of the NAND gates NA6 and NA7 of the spare column decoder 80. Accordingly, the output signals of the NAND gates NA6 and NA7 becomes logic high level regardless of the logic level of the global address signal GAY10 predecoded from the predecoder 30 provided as the other input signals of the NAND gates NA6 and NA7 and the redundancy column decoder 80 generates the spare column selection signals SYi(0) and SYi(1) of logic low level through the inverters IV28–IV30 and IV31–IV33.

As above descried, the global column address signals are not directly provided to the column main decoder 70 to degenerate the column selection signal SY(i). They are delayed for the minimum time desired for detecting the repair, that is time delayed through the address block repeater 60. Accordingly, if the redundancy addresses are received, the column main decoder 70 is activated and the spare column decoder 80 is non-activated. On the other hand, if the normal addresses are received, the column main decoder 70 is activated to generate the column selection signal Yi<n>.

As above described, the prior DRAM does not decode the column address signal Yi provided to the main column decoder 70 immediately. Although the normal address is received, the decoding operation is carried out after the desired minimum time, the delay time in the address block repeater 60. Therefore, the high data access speed is decreased.

Besides, in case where the redundancy circuit is provided in row and column of the memory cell array, if all the defects occurred in a chip are repaired by using the row spare redundancy circuit, the other spare column redundancy circuit is not required in the chip any more. Accordingly, unused redundancy circuit makes the data access speed down regardless of redundancy.

SUMMARY OF THE INVENTION

It is an object of the present invention to provide a semiconductor memory device with high data access speed by preventing delay through unnecessary redundancy circuit.

It is an aspect of the present invention to provide a semiconductor memory device, comprising: address input means for receiving an external column address signal; address buffer means for converting the external column address signal through address input terminal into an internal column address signal; address predecoder means for receiving the internal column address signal from the address buffer means and predecoding it to generate global column address signals; column redundancy fuse array means for generating a first detection signal indicating whether the global column address signals are normal address signals or spare address signals and a second detection signal indicating that the defect cells in a memory cell arry are fully repaired with any one of a column redundancy circuit or a row redundancy circuit; redundancy selection means for generating a spare column enable signal or a normal column enable signal in accordance with the first detection signal; address block repeater means for directly providing the global column address signals from the predecoder as column address signals in accordance with the second detection signal from the redundancy fuse array means regardless of the normal column enable signal, or for delay ing the global column address signals from the predecoder for a selected time in accordance with the normal column enable signal and providing them as the column address signals; column main decoder means for decoding the column address signals from the address block repeater means to generate a column selection signal; and spare column decoder means for generating a spare column selection signal by the spare column enable signal from the redundancy selection means.

According to the semiconductor memory device in accordance with an embodiment of this invention, the column redundancy fuse array means includes: a first detection signal generation means for generating the first detection signal indicating whether the global address signals are spare address signals or normal address signals; and a second detection signal generation means for generating the second detection signal indicating that defect cells are fully repaired with any one of the spare column redundancy circuit or the spare row redundancy circuit.

According to the semiconductor memory device in accordance with an embodiment of this invention, the second detection signal generation means includes: a capacitor for supplying a power voltage to a first node; a fuse connected between the first node and a ground; first and second inverters connected to the first node, for generating the second detection signal; and a PMOS transistor for supply the power supply voltage to the first node by an output of the first inverter.

According to the semiconductor memory device in accordance with an embodiment of this invention, the address block repeater means includes: first to fourth delay means for delaying the global address signals predecoded from the predecoder for a selected time; first to fourth switching means for directly providing the global column address signals as the column address signals to the column main decoder in a first state of the second detection signal; fifth to eighth switching means for providing the global column address signals delayed through the first to fourth switching means in a second state of the second detection signal; first to fourth NAND gates for respectively receiving output signals from the fifth to eighth switching means as one input signal, respectively and for receiving the normal column enable signal as the other input signal; and first to fourth inverters for respectively inverting output signals from the first to fourth NAND gates and for providing them as the column address signal to the column main decoder.

According to the semiconductor memory device in accordance with an embodiment of this invention, the first to fourth delay portions includes the even number of inverters connected in series and the first state of the second detection signal has a complementary logic level to the second state of the second detection signal.

DETAILED DESCRIPTION OF THE INVENTION

Figure 6:
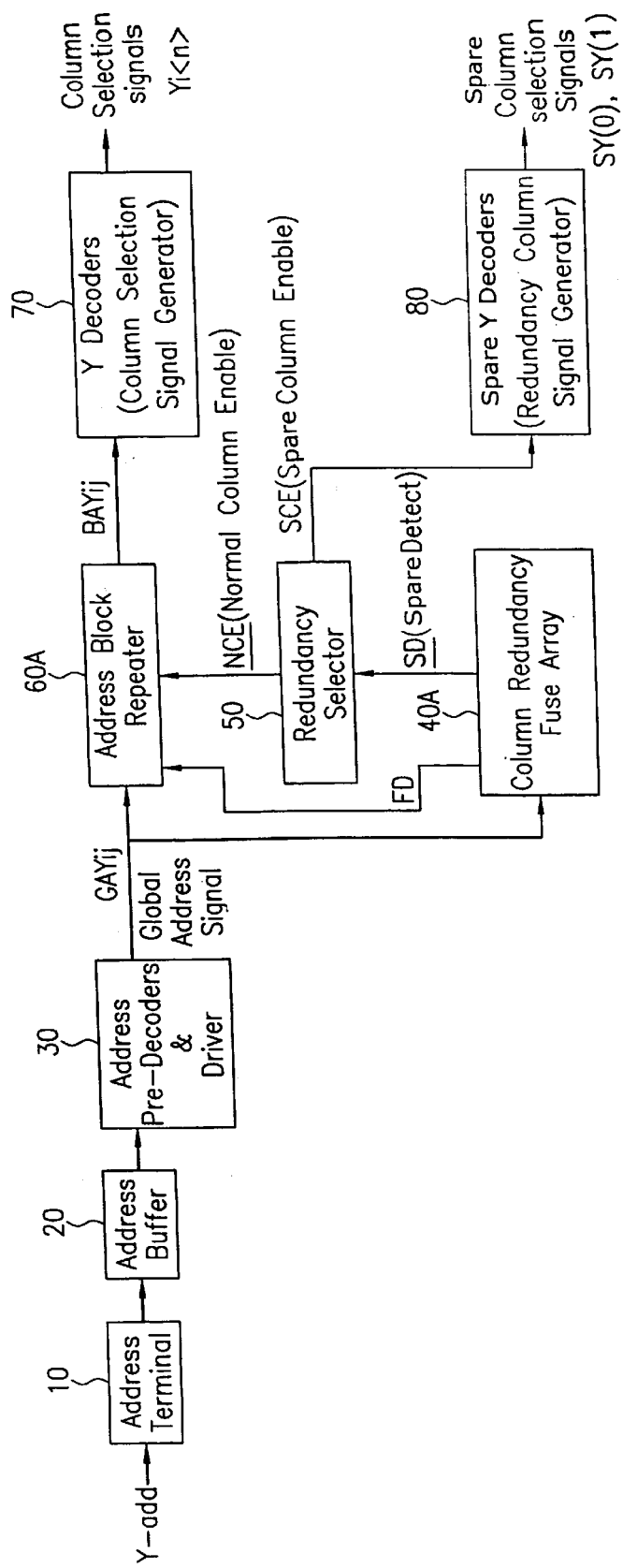
FIG. 6 is a block diagram of semiconductor memory device in accordance with an embodiment of this invention.

FIG. 6 is a block diagram of a semiconductor memory device in accordance with an embodiment of this invention. The semiconductor memory device includes in accordance with an embodiment of this invention: a plurality of address input terminals 10 for receiving an external column address signal Y-add bit by bit, respectively; a plurality of address input buffers 20 for converting the external column address signal from the address input terminals into an internal column address signal bit by bit, respectively; a predecoder 30 for predecoding the internal column address signal from the address input terminals to generate global column address signals GAYij; a column redundancy fuse array 40A for detecting whether the global column address signals are repair column address signals or not to generate an spare detection signal SD and for detecting whether all defect cells occurred in a memory cell array (not shown in drawings) are fully repaired with any one of a column redundancy circuit (not shown in drawings) or a row redundancy circuit (not shown in drawings) to generate a fuse detection signal FD; a redundancy selector 50 for receiving the spare detection signals to generate a normal column enable signal NCE and a spare column enable signal SCE; an address block repeater 60A for delaying the global column address signals GAYij in accordance with the normal column enable signal NCE and providing the delayed global column address signals as column address signals BAYij to a column main decoder 70, and for directly providing the global column address signals GAYij as the column address signals BAYij to the column main decoder 70 in accordance with the fuse detection signal FD; the column main decoder 70 for decoding the column address signals BAYij from the address block repeater 60A to a column selection signal Yi<n>; and a spare column decoder 80 for receiving the spare column enable signal from the redundancy selector 50 to generate spare column selection signals SYi<n>.

This invention embodies the redundancy circuit which control a remaining one unnecessary to repair of defect cells to be non-activated, after all defect cells of a memory cell array (not shown in drawings) are fully repaired any one of a row redundancy circuit or a column redundancy circuit (not shown in drawings). Accordingly, the present redundancy circuit blows a fuse of the column redundancy fuse array 40A to generate the fuse detection signal FD for indication of repair completion to the address block repeater 60A, when all the defect cells are fully repaired with any one of the column redundancy circuit or the row redundancy circuit.

When the fuse detection signal FD is provided to the address block repeater 60A, the address block repeater 60A directly provides the global column address signals GAYij from the address predecoder 30 as the column address signals to the column main decoder 70 regardless of input of the normal column enable signal NCE.

Figure 1:
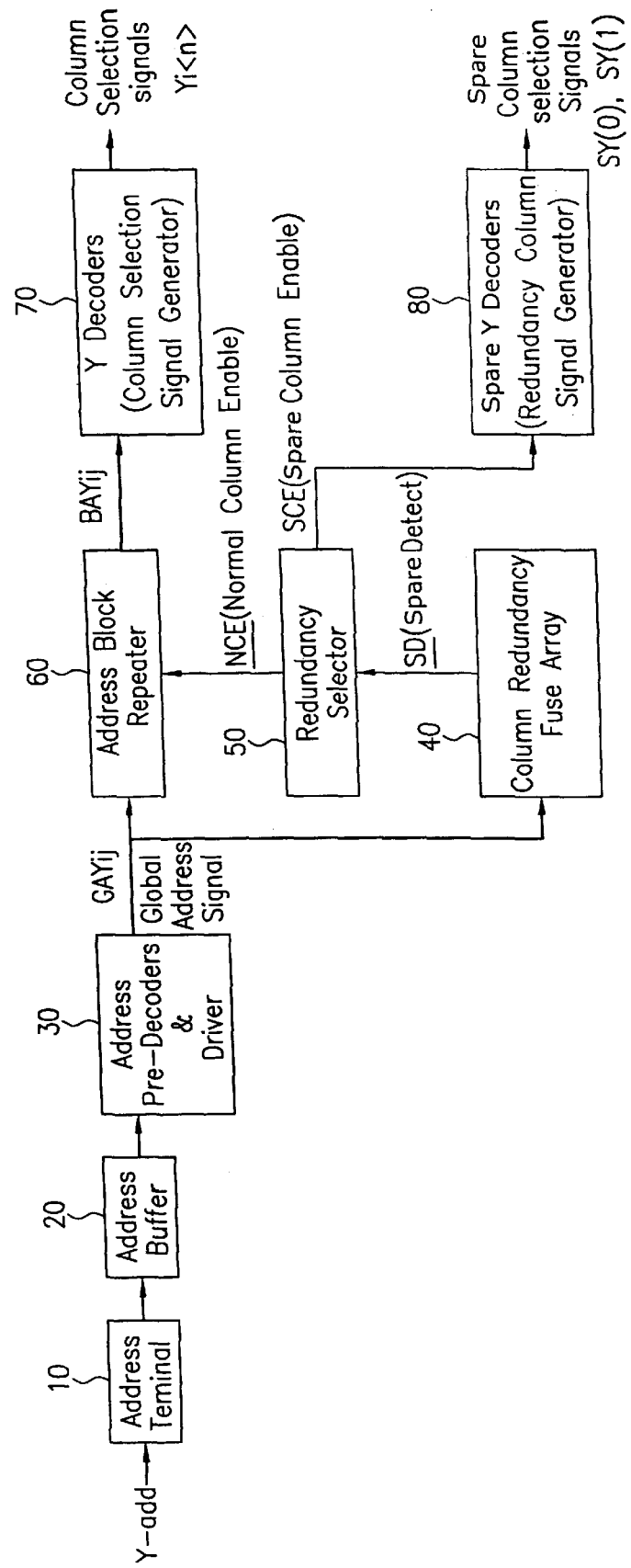
FIG. 1 is a block diagram of a semiconductor memory device in the prior art.
Figure 2:
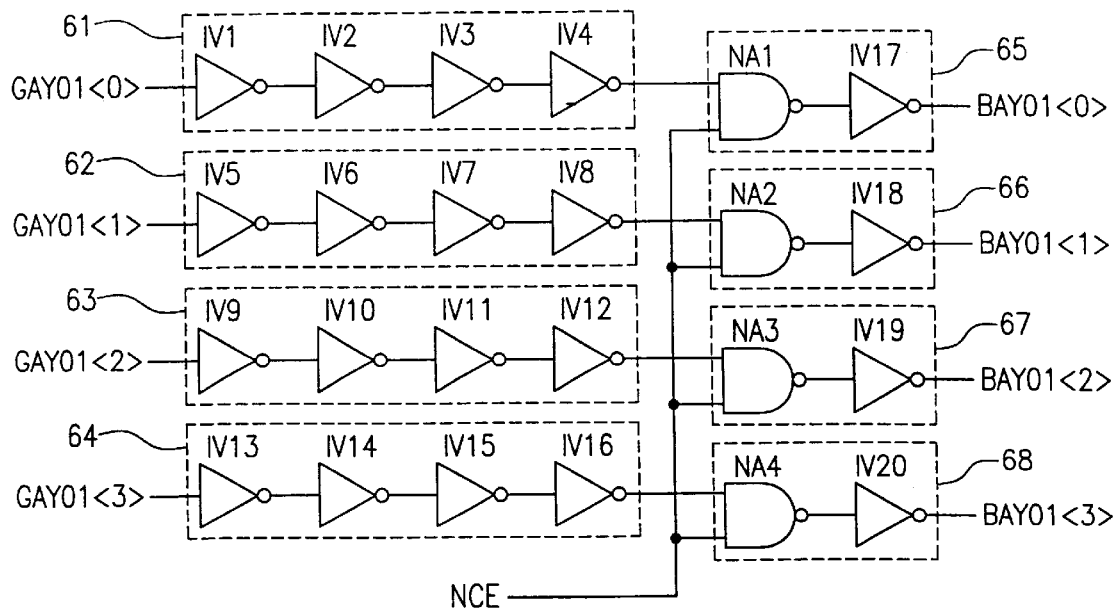
FIG. 2 is a circuit diagram of an address block repeater in FIG. 1.
Figure 3:
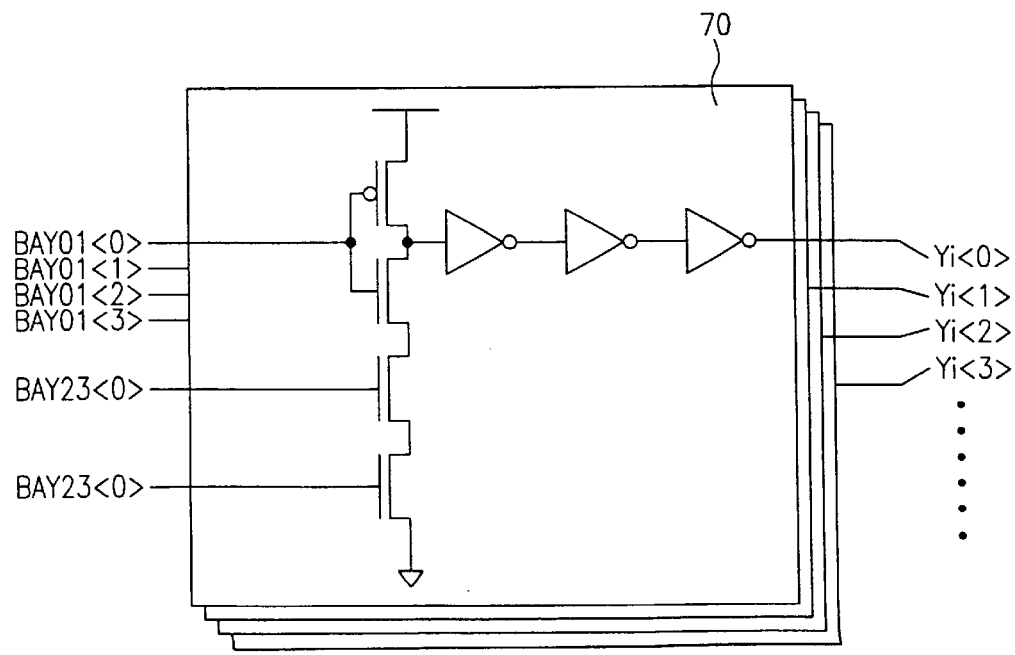
FIG. 3 is a circuit diagram of a main column decoder in FIG. 1.

In the prior art, although repair for defect cells is unnecessary, the address block repeater 60A of FIG. 1 unnecessarily delays the global column address signals GAYij from the address predecoder 30, until it receives the normal column enable signal NCE from the redundancy selector 50. Accordingly, access time is delayed. However, this invention solves the problem of delay in data access time with the fuse detection signal FD.

Figure 7:
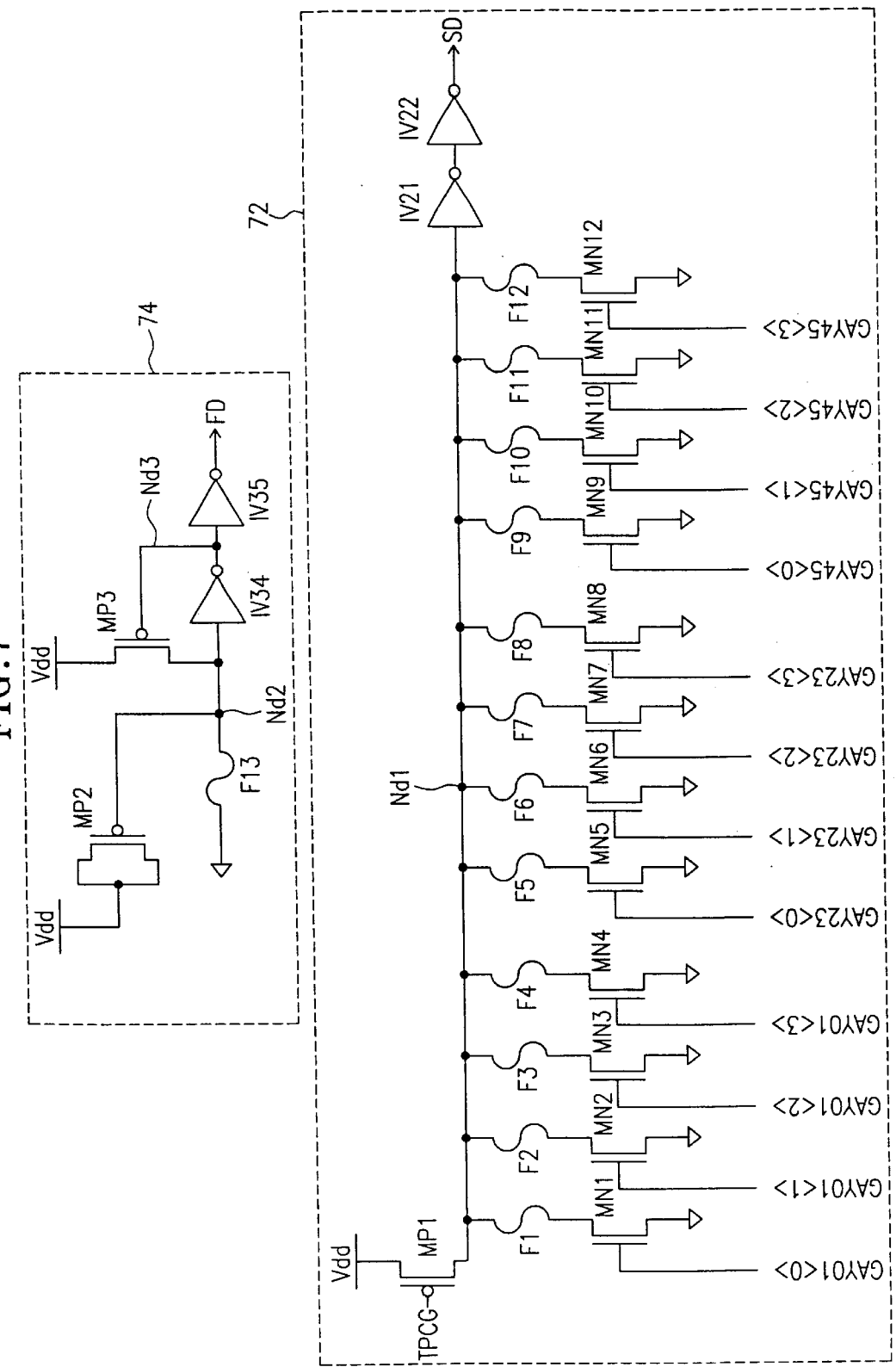
FIG. 7 is a circuit diagram of a column redundancy fuse array in FIG. 6.

FIG. 7 shows a circuit diagram of the column redundancy fuse array 40A of FIG. 6. The column redundancy fuse array 40A includes: a first detection signal generation portion 72 for detecting whether the global address signals are normal address signals or spare address signals to generate spare detection signals SD(0) and SD(1) to the spare column decoder 80; and a second detection signal generation portion 74 for detecting whether the defect cells are fully repaired with any one of the row redundancy circuit or the column redundancy circuit to generate the fuse detection signal FD to the address block repeater 60A.

Figure 4:
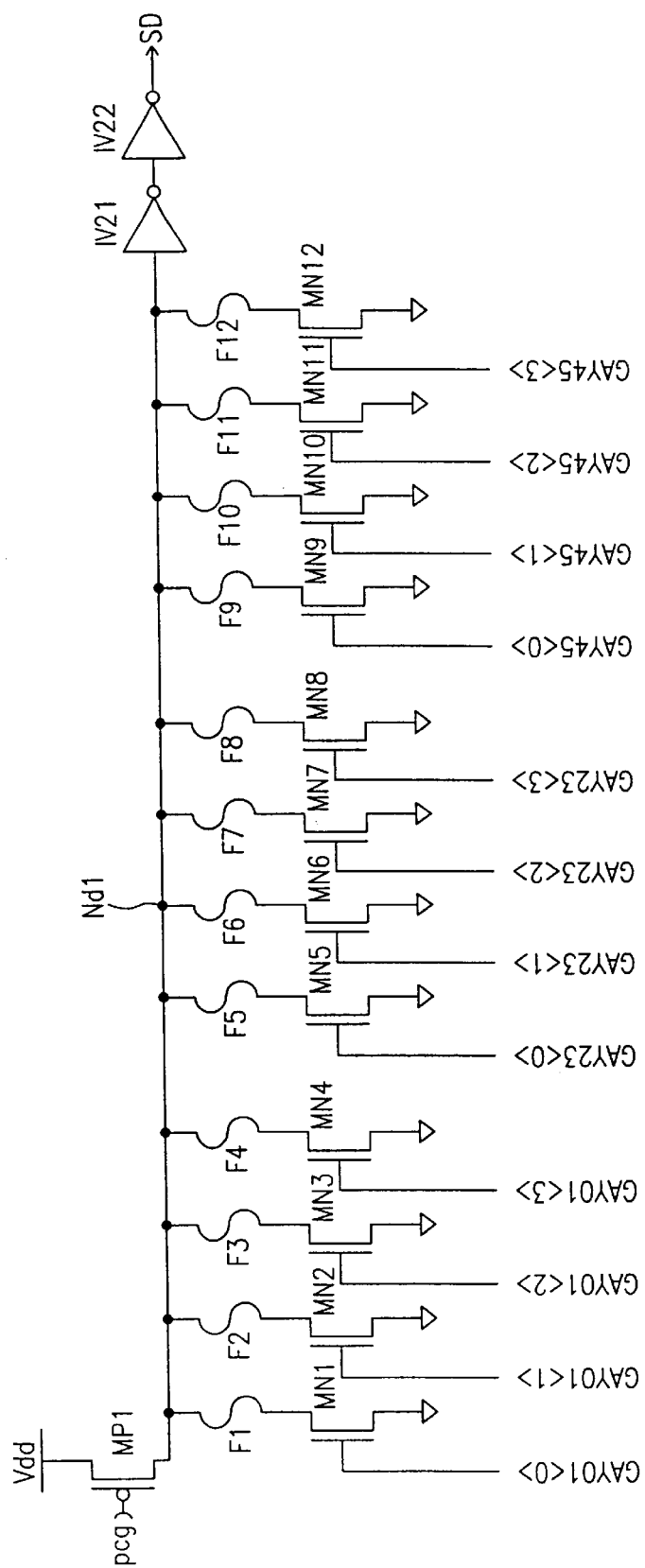
FIG. 4 is a circuit diagram of a redundancy fuse array in FIG. 1.

The construction and operation of the first detection signal generation portion 72 of the column redundancy fuse array 40A has the same as those of the column redundancy fuse array 40 in FIG. 4. The second detection signal generation portion 74 includes: a PMOS transistor for a capacitor connected between a power supply terminal and a node Nd2; a fuse 13 connected between the node Nd2 and a ground terminal Vss; inverters IV34 and IV35 connected to the node Nd1 in series to generate a fuse detection signal FD; and a PMOS transistor for precharing the node Nd2 with a power voltage Vdd by an output of the inverter IV34.

In case where all the fuses F1–F12 of the first detection signal generation portion 72 are not blown, for example in case where the all defect cell are repaired with the row redundancy circuit and the column redundancy circuit is unnecessary, the fuse F13 of the second detection signal generation portion 74 is blown and the fuse detection signal FD is generated. If the fuse F13 is blown, the fuse detection signal FD is set at logic high level in an initial power-up state. If the fuse F13 is not blown, the fuse detection signal FD is set at logic low level in an initial power-up state.

Figure 8:
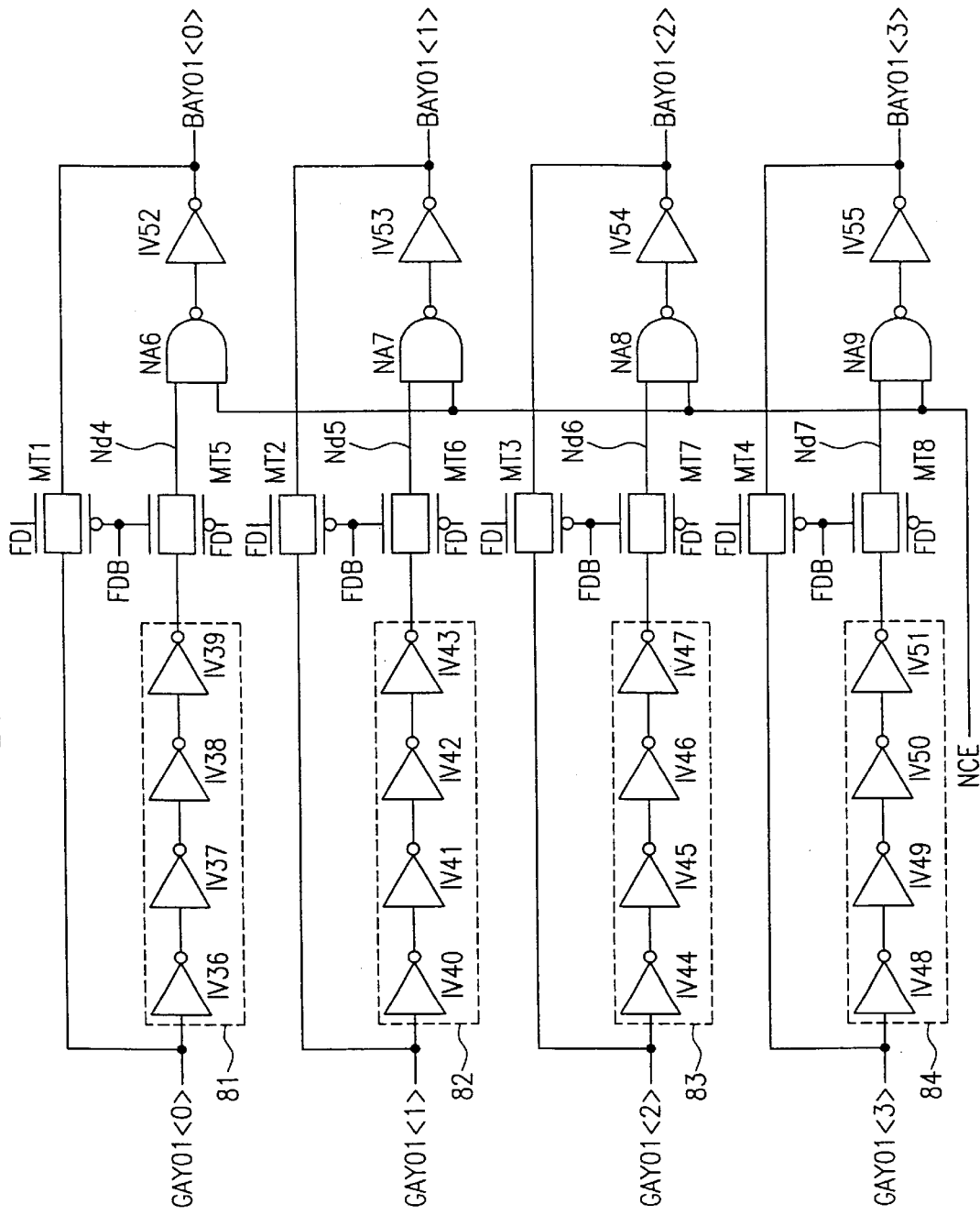
FIG. 8 is a circuit diagram of an address block repeater in FIG. 6.

FIG. 8 is a circuit diagram of the address block repeater in FIG. 6. The address block repeater 60A includes a first delay portion 61 to a fourth delay portion 64 for delaying the global column address signals GAY01<0>–GAY01<3> from the address predecoder 30 for a selected time, respectively; a first switching device MT1 to a fourth switching device MT4 for directly transferring the global address signals GAY01<0>–GAY01<3> as the column address signals BAY01<0>–BAY01<3> to the column main decoder 70 without delay of the global address signals GAY01<0>–GAY01<3> in accordance with the fuse detection signal FD and an inverted fuse detection signal FDB; a fifth switching device MT5 to the eighth switching device MT8 for transferring output signals of the delay portions 61–64 in accordance with the fuse detection signal FD and the inverted fuse detection signal FDB, respectively; NAND gates NA6–NA9 for receiving the normal column enable signal NCE and the output signals of the delay portions 61–64 through the switching devices MT5–MT8, respectively; and inverters IV52–IV55 for inverting output signals of the NAND gates and for providing them to the column main decoder as the column address signals BAY01<0>–BAY<3>, respectively.

If the fuse detection signal of logic high level is provided from the column redundancy fuse array 40A, the address block repeater 60A directly provides the global address signals GAY01<0>–GAY<3> to the column main decoder 70 through the switching devices MT1–MT4 controlled by the fuse detection signal FD and the inverted fuse detection signal FDB. That is, the global column address signals GAY01<0>–GAY01<3> are directly transferred to the column main decoder 70 as the column address signals BAY01<0>–BAY<3> without passing through the delay portions 61–64 regardless of the normal column enable signal NCE from the redundancy selector 50. Herein, the fuse detection signal FD of logic high state means that all defect cells are fully repaired with any one of the row redundancy circuit or the column redundancy circuit and the other one is not activated.

On the other hand, the fuse detection signal of logic low state is provided from the column redundancy fuse array 45, the address block repeater 60A delays the global address signals GAY01<0>–GAY<3> for a selected time through the delay portions 61–64. The global column address signals GAY01<0>–GAY01<3> delayed through the delayed portions 61–64 are provided to the NAND gates NA6–NA9, respectively together with the column enable signal NCE. The inverters IV52–IV55 invert the output signals of NAND gates NA6–NA9 and provide them to the column main decoder 70 as the column address signals BAY01<0>–BAY<3>. At this time, the global address signal is delayed to be adjusted to the input time of the normal column enable signal NCE from the redundancy selector 50.

The fuse detection signal FD is generated from the second signal generation portion 74 of the redundancy column fuse array 40A in FIG. 7. If any one of the row redundancy circuit or the column redundancy circuit is unnecessary, the fuse 13 is blown and the second fuse detection signal FD is set at logic high level in the initial power-up state.

The fuse detection signal of logic high level is provided to the address block repeater 60A of FIG. 8 as a control signal and controls the switching devices MT1–MT4 to provide the global column address signals GAY01<0>–GAY01<3> to the column main decoder 70 without delay. Accordingly, the column main decoder 70 directly the column address signals to generate the column selection signal Yi, thereby increasing the data access time.

Figure 5:
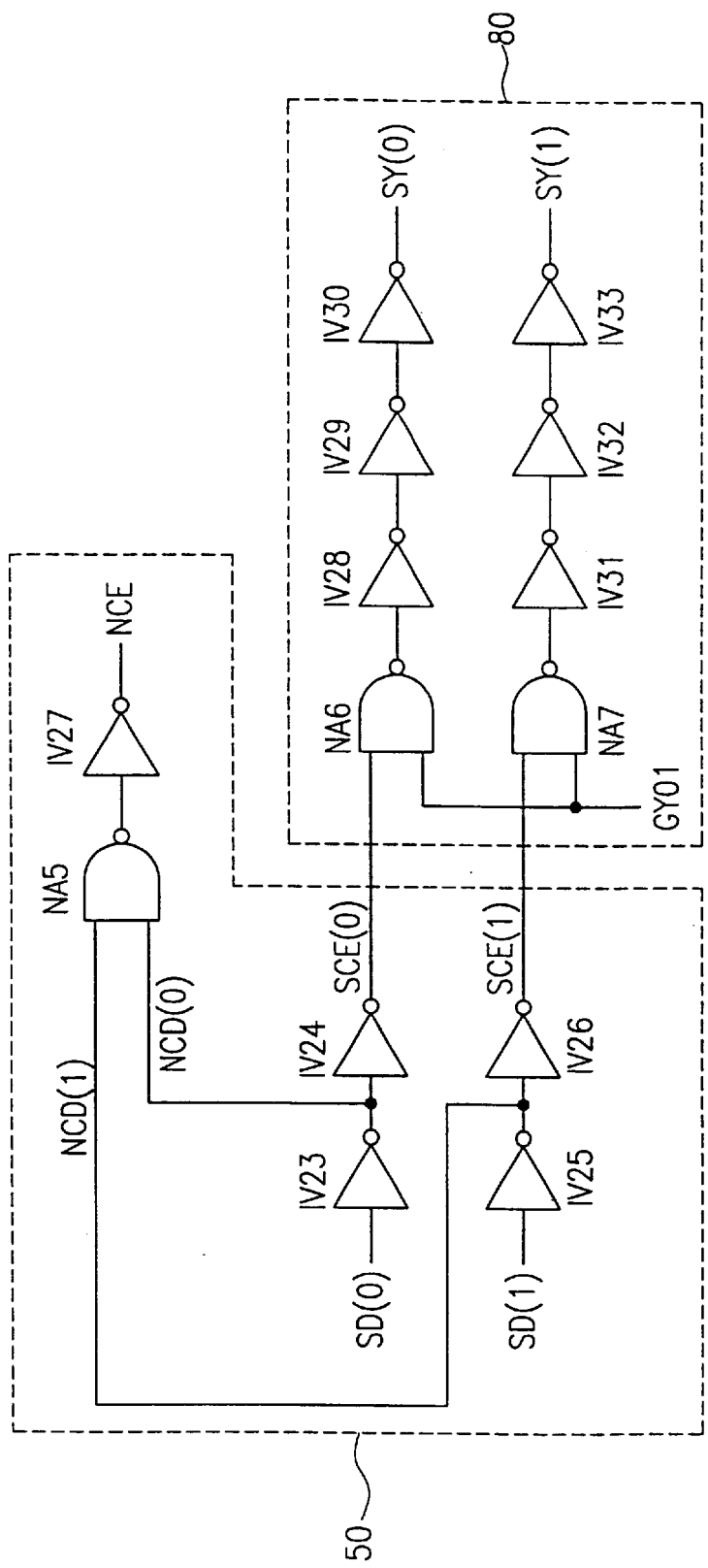
FIG. 5 is a circuit diagram of a redundancy selector and a redundancy column decoder in FIG. 1.

On the other hand, if anyone of the repair address is exist, that the defect cells are not fully repaired with any one of the row redundancy circuit or the column redundancy circuit, the fuse detection signal of logic low level is generated and the switching devices MT5–MT8 are turned on in the address block repeater 60A. Accordingly, the address block repeater 60A is operated as the address block repeater 60 of FIG. 5.

According to the present invention, the redundancy circuit of the semiconductor memory device makes unnecessary redundancy circuit to be non-activated, when all defect cells are fully repaired with any one of the row redundancy circuit or the column redundancy circuit, thereby increasing the data access time.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A semiconductor memory device, comprising:
    address input means for receiving an external column address signal;
    address buffer means for converting the external column address signal through address input terminal into an internal column address signal;
    address predecoder means for receiving the internal column address signal from the address buffer means and predecoding it to generate global column address signals;
    column redundancy fuse array means for generating a first detection signal indicating whether the global column address signals are normal address signals or spare address signals and a second detection signal indicating that the defects are fully repaired with any one of a column redundancy circuit or a row redundancy circuit;
    redundancy selection means for generating a spare column enable signal or a normal column enable signal in accordance with the first detection signal;
    address block repeater means for directly providing the global column address signals from the predecoder as column address signals in accordance with the second detection signal from the redundancy fuse array means regardless of the normal column enable signal, or for delaying the global column address signals from the predecoder for a selected time in accordance with the normal column enable signal and providing them as the column address signals;

column main decoder means for decoding the column address signals from the address block repeater means to generate a column selection signal; and spare column decoder means for generating a spare column selection signal by the spare column enable signal from the redundancy selection means.

2. The semiconductor memory device as claimed in claim 1, wherein the column redundancy fuse array means includes:

first detection signal generation means for generating the first detection signal indicating that the global address signals are spare address signals or normal address signals; and second detection signal generation means for generating the second detection signal indicating that defects are fully repaired with any one of the spare column redundancy circuit or the spare row redundancy circuit.

3. The mode detection circuit as claimed in claim 1, wherein the second detection signal generation means includes:

a capacitor for supplying a power voltage to a first node;

a fuse connected between the first node and a ground;

first and second inverters connected to the first node, for generating the second detection signal; and a PMOS transistor for supply the power supply voltage to the first node by an output of the first inverter.

4. The semiconductor memory device as claimed in claim 1, wherein the address block repeater means includes:

first to fourth delay means for delaying the global address signals predecoded from the predecoder for a selected time;

first to fourth switching means for directly providing the global column address signals as the column address signals to the column main decoder in a first state of the second detection signal;

fifth to eighth switching means for providing the global column address signals delayed through the first to fourth switching means in a second state of the second detection signal;

first to fourth NAND gates for respectively receiving output signals from the fifth to eighth switching means as one input signal, respectively and for receiving the normal column enable signal as the other input signal; and first to fourth inverters for respectively inverting output signals from the first to fourth NAND gates and for providing them as the column address signal to the column main decoder.

5. The semiconductor memory device as claimed in claim 4, wherein the first and the second state of the second detection signal have complementary logic levels.

6. The semiconductor memory device as claimed in claim 4, wherein each of the first and fourth delay means includes the even number of inverters connected in series.

* * * * *